United States Patent [19]

Nishimura et al.

[11] Patent Number: 4,462,150

[45] Date of Patent: Jul. 31, 1984

[54] METHOD OF FORMING ENERGY BEAM ACTIVATED CONDUCTIVE REGIONS BETWEEN CIRCUIT ELEMENTS

[75] Inventors: Hidetaro Nishimura, Kawasaki; Hiroshi Nozawa, Yokohama, both of Japan

[73] Assignee: Tokyo Shibaura Denki Kabushiki Kaisha, Kawasaki, Japan

[21] Appl. No.: 419,067

[22] Filed: Sep. 16, 1982

[30] Foreign Application Priority Data

Nov. 10, 1981 [JP] Japan ................... 56-179984

[51] Int. Cl.$^3$ ............... H01L 21/263; H01L 21/26
[52] U.S. Cl. ........................... 29/576 B; 29/577 C; 148/1.5; 148/187; 357/91; 427/53.1
[58] Field of Search ............... 29/576 B, 577 C; 148/1.5, 187; 357/91; 427/53.1

[56] References Cited

U.S. PATENT DOCUMENTS

| | | | |
|---|---|---|---|
| 3,771,026 | 11/1973 | Asai et al. | 317/234 R |
| 4,187,126 | 2/1980 | Radd et al. | 148/1.5 |
| 4,339,285 | 7/1982 | Pankove | 148/1.5 |
| 4,351,674 | 9/1982 | Yoshida et al. | 148/1.5 |
| 4,377,421 | 3/1983 | Wada et al. | 148/1.5 |
| 4,381,201 | 4/1983 | Sakurai | 148/1.5 |

OTHER PUBLICATIONS

Osamu Minato et al., "HI-CMOSII 4K Static RAM", IEEE Solid-State Circuits Conference, Feb. 18, 1981, pp. 14–15.

Primary Examiner—Upendra Roy
Attorney, Agent, or Firm—Finnegan, Henderson, Farabow, Garrett & Dunner

[57] ABSTRACT

A method of manufacturing semiconductor devices is disclosed. In the method, a redundancy circuit is formed by forming circuit elements making up an integrated circuit on a semiconductor substrate and a spare element connected to the circuit element through an electrically non-active region. Then, an impurity region is formed in the non-active region by introducing impurity and is electrically selectively activated with laser irradiation, whereby the circuit elements and the spare element are interconnected electrically.

8 Claims, 7 Drawing Figures

METHOD OF FORMING ENERGY BEAM ACTIVATED CONDUCTIVE REGIONS BETWEEN CIRCUIT ELEMENTS

BACKGROUND OF THE INVENTION

The present invention relates to a method of manufacturing a semiconductor device and, more particularly, to a process for fabricating a semiconductor device having a redundancy circuit.

In recent years, a redundancy technique has been employed in the manufacturing process of semiconductor devices. The reason for this is that the redundancy technique allows fail bits associated with random-defects, which are found in the semiconductor device fabricated, to be replaced by spare elements, thereby improving a manufacturing yield. One of the known methods for replacing the defective bits with the correct spare elements is that a polysilicon (polycrystalline silicon) film resistor made of polysilicon or the like connecting a correct element to an integrated circuit is fused by conduction of electrical current or irradiation by a laser. For fusing the polysilicon film resistor through the conduction of electricity, a circuit for suppling current is required and a large capacitive transistor must be provided for feeding a large current. During the process of fusing the film resistor by the conduction of electricity or laser irradiation the resultant melted material is scattered on its peripheral circuits. More adversely, at the time of the fusing, the peripheral circuits and/or layers under the film resistor may be destroyed. Further, microdefects may be formed in the structure near the film resistor due to the fusing of the film resistor, thus resulting in degradation of the reliability of the semiconductor devices manufactured.

In 1981 IEEE International Solid-State Circuits Conference, a research worker in Hitachi Central Research Laboratory disclosed a technique to transform a polysilicon film into a conductive material by diffusing an impurity into the polysilicon film on both sides by application of lower pulses. For further details of this technique, reference is made to ISSCC Digest of Technical Papers P14, Feb. 1981.

In the redundancy technique, for column decoders, spare elements are programmed by applying laser pulses to an intrinsic polysilicon film having an N+ diffusion on either side, and by electrically connecting the two N+ diffusions. By this process, the intrinsic polysilicon film having a resistivity of more than $10^9$ ohms is changed to a conductivity film with a resistivity of less than $10^3$ ohms.

SUMMARY OF THE INVENTION

Accordingly, an object of the present invention is to provide a method of fabricating high reliability semiconductor devices, free of microdefects from a semiconductor substrate with a redundancy circuit, free from formation of microdefects.

To achieve the above object, there is provided a method of manufacturing semiconductor devices comprising the steps of: forming circuit elements making up an integrated circuit on a semiconductor substrate of one conductivity type; forming on the semiconductor substrate a spare element connected to the circuit elements through an electrically non-active region; forming an impurity region by introducing a first impurity into the non-active region; and connecting electrically the circuit elements to the spare element by electrically activating the impurity region.

The non-active region for connecting the circuit elements to the spare element may be formed in the semiconductor substrate or in the polysilicon film formed on the semiconductor substrate.

An impurity of the same conductivity type as that of the circuit elements or the spare element may be introduced into a connection part of the non-active region to the circuit element and a connection part of the circuit element to the spare element.

The activation applied to the impurity region may be laser irradiation, electron irradiation, ion irradiation, or the like.

It is confirmed that a sheet resistance of the impurity region is decreased with increasing dosage of the impurity introduced into the impurity region, as shown in FIG. 1.

DETAILED DESCRIPTION OF THE PREFERRED EMBODIMENTS

Figure 1:
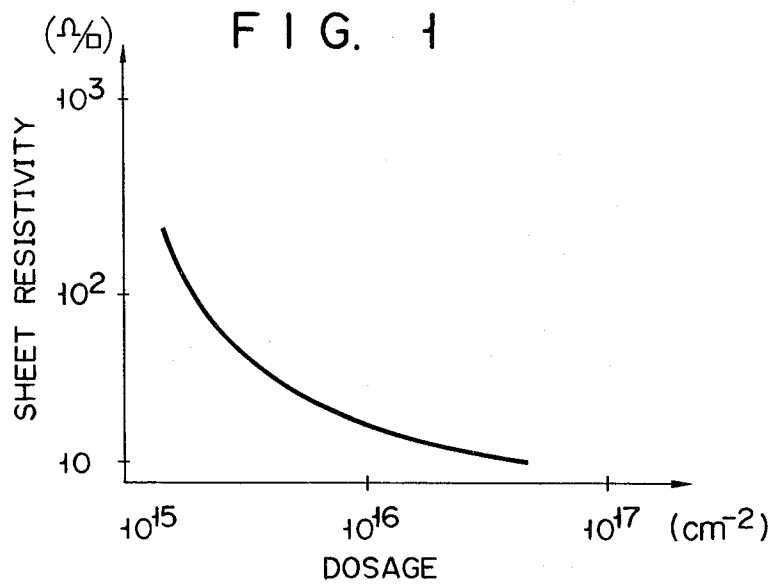
FIG. 1 shows a graph describing a relationship of a dosage of impurity ion implanted into a non-active region for forming an impurity region to a sheet resistance of the impurity region.
Figure 2A:
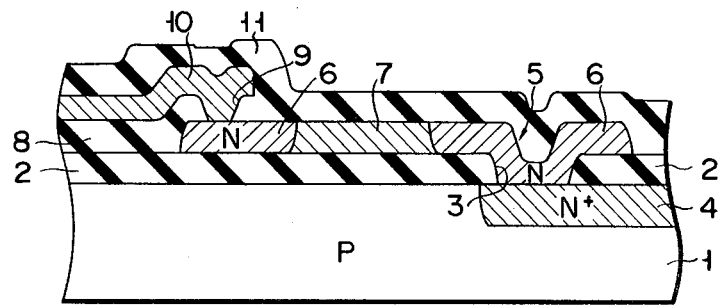
FIGS. 2(A) to 2(C) show a set of cross-sectional views illustrating a sequence of steps of manufacturing a semiconductor device with a redundancy circuit formed at a polysilicon film, which is an embodiment of the present invention.
Figure 2B:
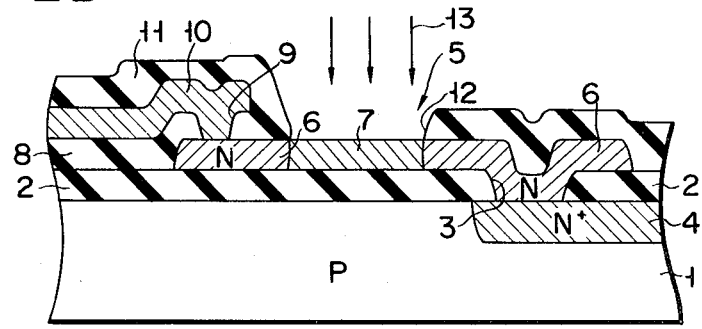
Figure 2C:
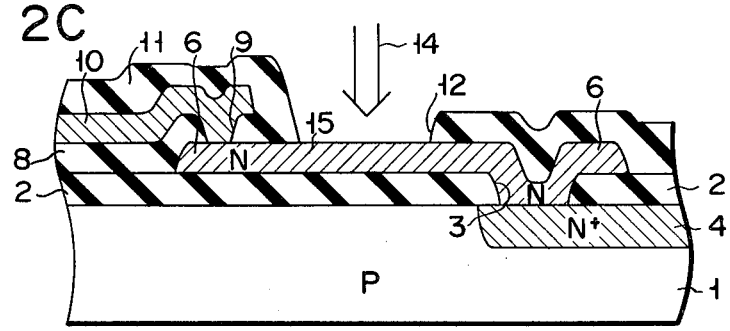

The present invention will now be described with the reference to examples applied to the fabrication of a semiconductor device having a redundancy circuit at the polysilicon film formed on the silicon substrate, referring to FIGS. 2(A) to 2(C).

EXAMPLE 1

A p-type silicon substrate 1 having circuit elements (not shown) making up an integrated circuit is prepared. An $SiO_2$ film 2 is formed on the P-type silicon substrate 1 by a CVD (chemical vapor deposition) process, for example. Then, a photoresist film is formed on the $SiO_2$ film 2. A through hole is formed in the photoresist film by a photolithography process. A chemical etching is applied to the $SiO_2$ film 2, using the photoresist film with the through hole formed, thereby to form a through hole 3 in the $SiO_2$ film 2. After removing the photoresist film, an impurity of phosphorus is diffused into the P-type silicon substrate 1 with a mask of the $SiO_2$ film 2 with the through hole 3, thereby to form an N+-type impurity region 4 as a spare element. Then, a polysilicon film 5, connected through the through hole 3 to the N+ type impurity region 4, is formed on the $SiO_2$ 2 by a vapor deposition process. The polysilicon film 5 is selectively etched to form a pattern with a given configuration. Impurity diffusion of phosphorous is applied to an end of the polysilicon film 5 to the N+-type impurity region 4 and the other end thereof, thereby to form an N-type impurity region 6. The sheet resistance $\rho s$ of a non-active region 7 of the polysilicon film 5 separated by the N+-type impurity region 4 is $1 \times 10^{10}$ Ω/□. The thickness of the polysilicon film 5 is chosen as 2000 to 8000 Å. A SiO$_2$ film 8 is formed on the polysilicon film 5. A contact window 9 opening to the N-type impurity region 6 of the polysilicon film 5 is opened in the SiO$_2$ film 8 by the chemical etching process. Further formed is an aluminum film 10 connecting through the contact hole 9 to the N-type impurity region 6 and to a circuit element (not shown) previously formed in the silicon substrate 1. The aluminum film 10 is patterned to form a redundancy circuit having circuit elements and a spare element by the polysilicon film 5. Further, an SiO$_2$ film 11 is formed on the aluminum film 8 by the CVD process (FIG. 2A).

Then, a window 12 is opened in a part of the SiO$_2$ film 11 in the non-active region 7 by the photolithography technique. With a mask of the SiO$_2$ film 11 with the window 12, $^{31}$P+ impurity 13 of the same conductivity type as that of the impurity region 6 is ion-implanted into the non-active region 7. The condition for the ion-implantation is properly set up according to a value of the sheet resistance ρs of the non-active region 7 and the thickness of the polysilicon film 5. In the present example, the accelerating energy was 160 KeV and a dosage of the impurity was $5 \times 10^{15}$ cm$^{-2}$. The sheet resistance of the non-active impurity region 7 after the ion implantion was still $1 \times 10^{10}$ Ω/□ and kept an electrical inactive condition (FIG. 2-(B)).

The non-active region 7 implanted with the $^{31}$P+ impurity is selectively subjected to a laser annealing treatment. Through the annealing treatment, the non-active region 7 is rendered electrically active (FIG. 2(C)). The laser beam 14 used was produced by an neodymium Nd doped YAG laser and had a beam diameter of approximately 10 μm, so as to selectively activate the non-active region 7. An irradiation condition of the laser beam 14 was: 0.5 to 1.0 J/cm$^2$ for an amount of energy and approximately 40 nsec for the pulse width.

The sheet resistance ρs of the non-active region 7 electricaly activated with the irradiation of the laser beam 14 was measured to be approximately 20 to 30 Ω/□. Thus, it was empirically measured that the circuit elements and the spare element were electrically connected in a conductive state by the activated region 15. In our experiment, no random defects were found in the peripheral part of the activated region 15. Thus, the semiconductor device fabricated had an extremely high reliability.

EXAMPLE 2

A P-type silicon substrate 1 having circuit elements (not shown) making up an integrated circuit is prepared. An impurity of phosphorous is selectively introduced into the P-type silicon substrate 20 to form an N+-type impurity region 21 serving as a spare element and an N+-type impurity region 23 with an electrical non-active region 22 of the substrate 20 interlayered therebetween. An SiO$_2$ film 24 is formed by the CVD process to cover the N+-type impurity regions 21 and 23 and the non-active region 22. Chemical etching is selectively applied to the SiO$_2$ film 24 to form a contact window 25 reaching to the impurity region 23. In the fabricating step to follow, formed on the SiO$_2$ film 24 is an aluminum film 26 connected through the contact window 25 to the N+-type impurity region 23 and to the circuit elements formed in the silicon substrate 20. The aluminum film 26 is patterned to obtain a redundancy circuit in which the circuit elements and the spare element are connected through the non-active region 22 of the silicon substrate 20. An SiO$_2$ film 27 is formed by the CVD process to cover the aluminum film 26 and the SiO$_2$ film 24.

Figure 3A:
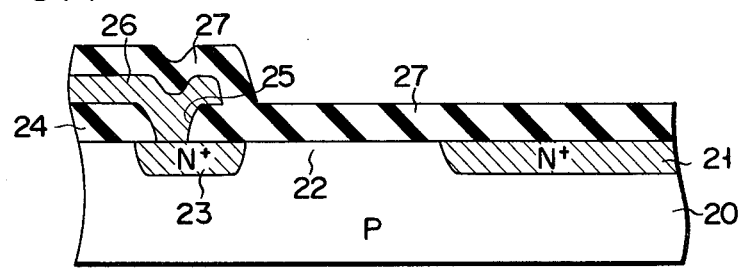
FIGS. 3(A) to 3(C) show a set of cross-sectional views illustrating a sequence of steps for manufacturing a semiconductor device with a redundancy circuit in a semiconductor substrate, which is another embodiment of the present invention.
Figure 3B:
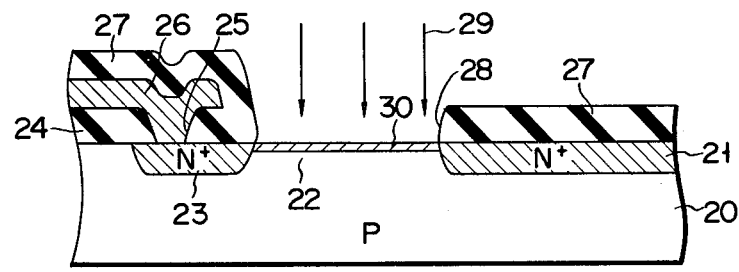

In the next step, using the photolithography technique, a window 28 is opened in the SiO$_2$ films 24 and 27 on the non-active region 22. With a mask of the films 24 and 27 having the window 28, $^{31}$P+ impurity 29 of the same conductivity type as that of the impurity regions 21 and 23 is ion-implanted into the non-active region 22, thereby to form an impurity region 30 (FIG. 3B). In this case, an acceleration energy was 160 KeV and a dosage of the impurity $5 \times 10^{15}$ cm$^{-2}$. After the formation of the impurity region 30, the spare element and the circuit element were not interconnected electrically.

Figure 3C:
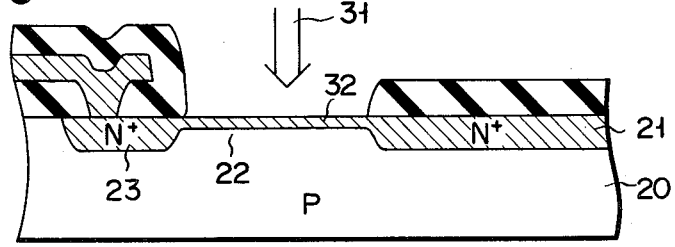

Then, the impurity region 30 is selectively irradiated with a laser beam 31 at the energy density of 0.5 to 1.0 J/cm$^2$ and with the pulse width of 40 nsec, thereby to electrically activate the impurity region 30 in the non-active region 22 coupling the spare element with the circuit elements (FIG. 3(C)). The region 32 electrically activated with the laser irradiation exhibited a sheet resistance ρs of approximately from 20 to 30 Ω/□. This indicates that the circuit elements and the spare element are completely interconnected. Further, no random defects were found in the peripheral part of the activated region 32.

Thus, the semiconductor device fabricated has an extremely high reliability.

What we claim is:

1. A method of manufacturing semiconductor devices comprising the steps of:
   forming circuit elements making up an integrated circuit on a semiconductor substrate of one conductivity type;
   forming on said semiconductor substrate a spare element connected to said circuit elements through an electrically non-active region;
   forming an impurity region by introducing ions into said non-active region;
   connecting electrically said circuit elements to said spare element by electrically activating impurity ions of said impurity region.

2. A method according to claim 1, in which said non-active region is formed by separating a specific region in the semiconductor substrate by the impurity region.

3. A method according to claim 1, in which said non-active region is formed within a polycrystalline silicon layer which is formed above the semiconductor substrate.

4. A method according to claim 3, in which an insulating layer is formed between the semiconductor substrate and the polycrystalline silicon layer.

5. A method according to one of claims 1, 2, 3 and 4, in which said means for electrically activating said impurity region is means for irradiating said impurity region with a laser beam.

6. A method according to claim 5, in which a laser beam irradiating energy is 0.5 to 1.0 J/cm$^2$.

7. A method according to one of claims 1, 2, 3 and 4, in which said means for electrically activating said impurity region is means for irradiating the impurity region with an electron beam.

8. A method according to one of claims 1, 2, 3 and 4, in which said means for electrically activating the impurity region is means for subjecting the impurity region to ion irradiation.

* * * * *